United States Patent
Li et al.

(10) Patent No.: US 10,923,481 B2
(45) Date of Patent: Feb. 16, 2021

(54) SEMICONDUCTOR INTEGRATED CIRCUIT STRUCTURE

(71) Applicants: UNITED MICROELECTRONICS CORP., Hsin-Chu (TW); Fujian Jinhua Integrated Circuit Co., Ltd., Quanzhou (CN)

(72) Inventors: Yu-Ting Li, Chiayi (TW); Jen-Chieh Lin, Kaohsiung (TW); Wen-Chin Lin, Tainan (TW); Po-Cheng Huang, Kaohsiung (TW); Fu-Shou Tsai, Keelung (TW)

(73) Assignees: UNITED MICROELECTRONICS CORP., Hsin-Chu (TW); Fujian Jinhua Integrated Circuit Co., Ltd., Quanzhou (CN)

( * ) Notice: Subject to any disclaimer, the term of this patent is extended or adjusted under 35 U.S.C. 154(b) by 0 days.

(21) Appl. No.: 16/151,323

(22) Filed: Oct. 3, 2018

(65) Prior Publication Data
US 2019/0035794 A1  Jan. 31, 2019

Related U.S. Application Data

(62) Division of application No. 15/261,845, filed on Sep. 9, 2016, now Pat. No. 10,128,251.

(51) Int. Cl.
*H01L 27/10* (2006.01)
*H01L 27/108* (2006.01)
(Continued)

(52) U.S. Cl.
CPC .... *H01L 27/10888* (2013.01); *H01L 21/8234* (2013.01); *H01L 27/06* (2013.01);
(Continued)

(58) Field of Classification Search
CPC .......... H01L 27/10888; H01L 21/8234; H01L 27/06; H01L 27/10894; H01L 27/10885;
(Continued)

(56) References Cited

U.S. PATENT DOCUMENTS 6,177,307 B1   1/2001 Tu
7,915,121 B1   3/2011 Kim
(Continued)

FOREIGN PATENT DOCUMENTS

CN       1290035 A    4/2001
CN     102097375 A    6/2011
(Continued)

*Primary Examiner* — Charles D Garber
*Assistant Examiner* — S M Sohel Imtiaz
(74) *Attorney, Agent, or Firm* — Winston Hsu

(57) ABSTRACT

A semiconductor IC structure includes a substrate including at least a memory cell region and a peripheral region defined thereon, a plurality of memory cells formed in the memory cell region, at least an active device formed in the peripheral region, a plurality of contact plugs formed in the memory cell region, and at least a bit line formed in the memory cell region. The contact plugs are physically and electrically connected to the bit line. More important, bottom surfaces of the contact plugs are lower a surface of the substrate.

7 Claims, 10 Drawing Sheets

(51) Int. Cl.
*H01L 27/06* (2006.01)
*H01L 21/8234* (2006.01)

(52) U.S. Cl.
CPC .. *H01L 27/10823* (2013.01); *H01L 27/10876* (2013.01); *H01L 27/10885* (2013.01); *H01L 27/10894* (2013.01)

(58) Field of Classification Search
CPC ......... H01L 27/10823; H01L 27/10847; H01L 27/10844; H01L 27/10805
See application file for complete search history.

(56) References Cited

U.S. PATENT DOCUMENTS

| | | | |
|---|---|---|---|
| 8,367,534 B2 | 2/2013 | Chen et al. | |
| 2002/0153544 A1* | 10/2002 | Ogata | H01L 21/76802 257/296 |
| 2004/0259295 A1* | 12/2004 | Tomiye | H01L 27/1116 438/155 |
| 2005/0095779 A1* | 5/2005 | Park | H01L 21/76838 438/238 |
| 2006/0113547 A1* | 6/2006 | Shin | H01L 27/11526 257/77 |
| 2008/0017904 A1* | 1/2008 | Akiyama | G11C 7/18 257/300 |
| 2009/0220894 A1 | 9/2009 | Fukuhara | |
| 2010/0200948 A1 | 8/2010 | Kim | |
| 2010/0270602 A1* | 10/2010 | Choi | H01L 27/10876 257/296 |
| 2011/0133283 A1* | 6/2011 | Park | H01L 27/10894 257/368 |
| 2012/0086054 A1* | 4/2012 | Cheng | H01L 29/7833 257/288 |
| 2012/0098051 A1* | 4/2012 | Son | H01L 29/66833 257/324 |
| 2012/0258596 A1 | 10/2012 | Busch | |
| 2013/0026564 A1* | 1/2013 | Cho | H01L 21/768 257/334 |
| 2015/0171163 A1* | 6/2015 | Lee | H01L 27/10888 257/506 |
| 2015/0249086 A1 | 9/2015 | Divakaruni | |
| 2016/0064285 A1* | 3/2016 | Moriwaki | H01L 21/02532 438/5 |

FOREIGN PATENT DOCUMENTS

| | | |
|---|---|---|
| CN | 102097435 A | 6/2011 |
| CN | 105575828 A | 5/2016 |

* cited by examiner

SEMICONDUCTOR INTEGRATED CIRCUIT STRUCTURE

CROSS REFERENCE TO RELATED APPLICATIONS

This application is a division of application Ser. No. 15/261,845 filed on Sep. 9, 2016, now allowed, which is incorporated by reference herein in its entirety.

BACKGROUND OF THE INVENTION

1. Field of the Invention

The present invention relates to a semiconductor integrated circuit (hereinafter abbreviated as IC) structure and method for forming the same, and more particularly, to a semiconductor IC structure and method with planarization process involved.

2. Description of the Prior Art

Planarization is useful in semiconductor industries, among different approaches, chemical mechanical polishing (hereinafter abbreviated as CMP) process is a common technique widely used to remove excess deposited materials and to provide a planar surface for subsequent levels or processes. In general, CMP process is performed to planarize layer(s) deposited on a patterned layer or a structure. And today, it has become one of the critical processes in the semiconductor fabrication flow.

The miniaturization of integrated circuits has been a key driving force behind technological innovations. Miniaturization of devices and interconnects has occurred because of the rapid advances in various fabrication technologies. As mentioned above, CMP process is performed to planarize layer(s) and thus to reduce topography variation of a wafer. However it is found that IC(s) nowadays include various devices and thus complexity and challenges are arisen to the manufacturing processes, including CMP process. For example, step height has been found between different devices or different regions. The basic problem in this respect is that different densities and spacings of features in the layout of a semiconductor chip influence the planarizing properties of the CMP process. Unfavorably selected processing parameters then lead to a large variation in layer thickness across the chip surface subsequent to the CMP process (global topography). On the other hand, an unfavorably selected circuit layout leads to insufficient planarizing. The insufficient planarizing impairs the follow-up processes and thus the product characteristics.

Therefore, it is still in need to provide a method for forming the semiconductor IC structure that is able to simplify CMP process and to eliminate the step height issue.

SUMMARY OF THE INVENTION

According to an aspect of the present invention, a semiconductor IC structure is provided. The semiconductor IC structure includes a substrate including at least a memory cell region and a peripheral region defined thereon, a plurality of memory cells formed in the memory cell region, at least an active device formed in the peripheral region, a plurality of contact plugs formed in the memory cell region, and at least a bit line formed in the memory cell region. The contact plugs are physically and electrically connected to the bit line. More important, bottom surfaces of the contact plugs are lower a surface of the substrate.

According to an aspect of the present invention, a method for forming a semiconductor IC structure is provided. The method includes following steps. A substrate including a memory cell region and a peripheral region defined thereon is provided, and a plurality of memory cells are formed in the memory cell region. Next, a first semiconductor layer is formed in the peripheral region and an insulating layer covering the first semiconductor layer is formed on the substrate. After forming the first semiconductor layer and the insulating layer, a second semiconductor layer is formed on the substrate, and the second semiconductor layer covers the substrate, the first semiconductor layer and the insulating layer. Subsequently, a two-stepped planarization process is performed to remove a portion of the second semiconductor layer and the insulating layer to expose the first semiconductor layer, and a top surface of the first semiconductor layer and a top surface of the second semiconductor layer are coplanar.

According to an aspect of the present invention, another method for forming a semiconductor IC structure is provided. The method includes following steps. A substrate including a memory cell region and a peripheral region defined thereon is provided. And a plurality of memory cells are formed in the memory cell region. Next, a first semiconductor layer is formed in the peripheral region and a first insulating layer covering the first semiconductor layer is formed on the substrate. After forming the first semiconductor layer and the first insulating layer, a second semiconductor layer, a second insulating layer and a third insulating layer are sequentially formed on the substrate to cover the first semiconductor layer and the first insulating layer. Subsequently, a planarization process is performed to remove a portion of the third insulating layer to expose the second insulating layer such that a top surface of the third insulating layer and a top surface of the second insulating layer are coplanar. After the planarization process, an etching back process is performed to remove the third insulating layer, the second insulating layer, a portion of the second semiconductor layer and a portion of the first insulating layer such that a top surface of the first semiconductor layer and a top surface of the second semiconductor layer are coplanar.

According to the method for forming the semiconductor IC structure, the planarization process is simplified to be a two-stepped planarization, which is completed in one apparatus, and still able to eliminate the step height issue. Or, the third insulating layer and the second insulating layer are introduced to eliminate the step height issue. Consequently, high uniformity across regions with different densities is guaranteed.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-5 and 9-10 are schematic drawings illustrating a method for forming a semiconductor IC structure provided by a first preferred embodiment of the present invention, wherein FIG. 2 is a schematic drawing in a step subsequent to FIG. 1, FIG. 3 is a schematic drawing in a step subsequent to FIG. 2, FIG. 4 is a schematic drawing in a step subsequent to FIG. 3, FIG. 5 is a schematic drawing in a step subsequent to FIG. 4, FIG. 9 is a schematic drawing in a step subsequent to FIG. 5, and FIG. 10 is a cross-sectional view taken along a line A-A' of FIG. 9.

FIGS. 6-8 are schematic drawings illustrating a method for forming a semiconductor IC structure provided by a second preferred embodiment of the present invention, wherein FIG. 7 is a schematic drawing in a step subsequent to FIG. 6, and FIG. 8 is a schematic drawing in a step subsequent to FIG. 7.

DETAILED DESCRIPTION

Figure 1:
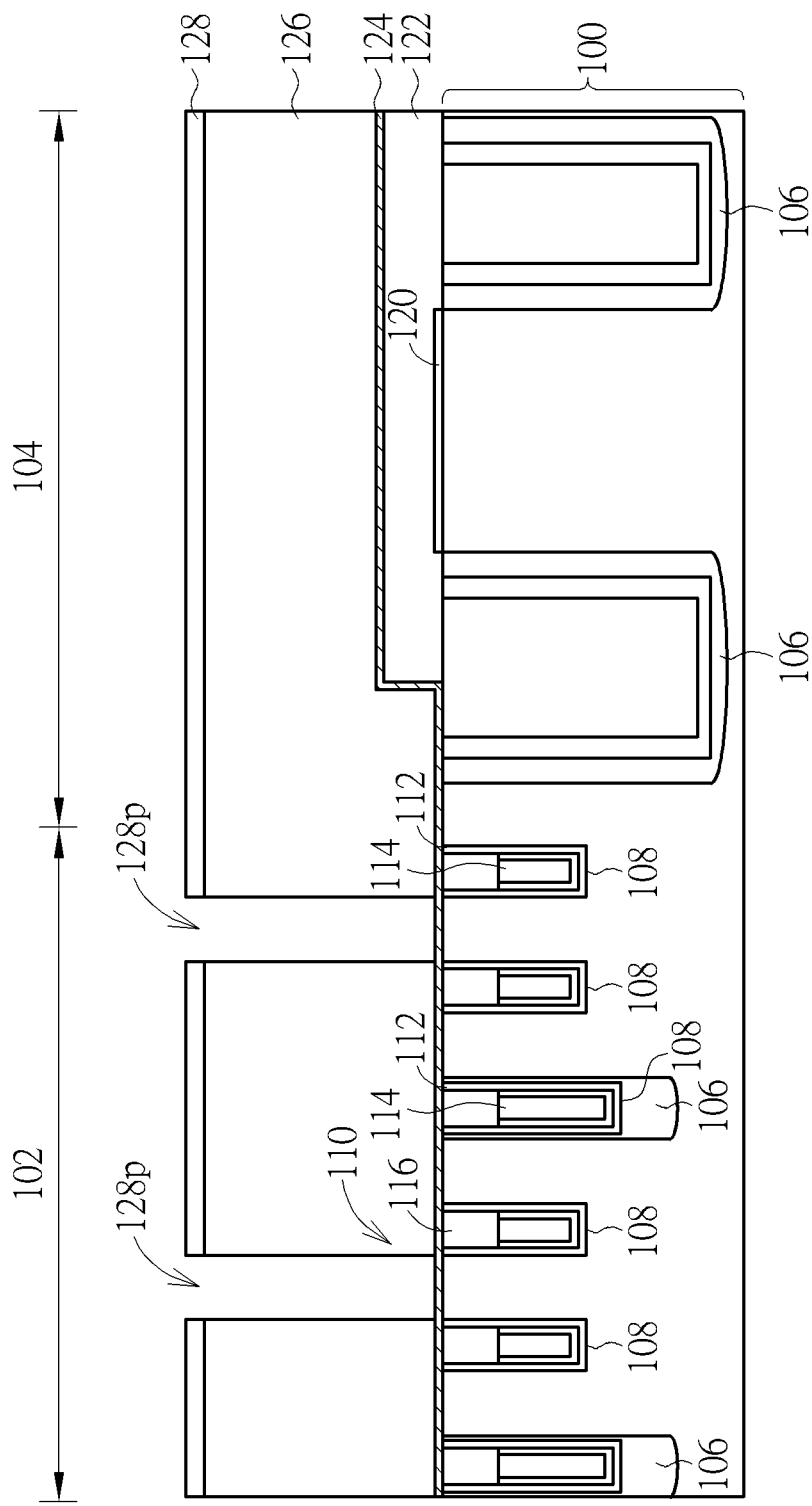

Please refer to FIGS. 1-5 and 10, which are schematic drawings illustrating a method for forming a semiconductor IC structure provided by a first preferred embodiment of the present invention. As shown in FIG. 1, a substrate 100 including a memory cell region 102 and a peripheral region 104 defined thereon is provided. And a plurality of memory cells 110 are formed in the memory cell region 102. The memory cells 110 include dynamic random access memory (hereinafter abbreviated as DRAM) cells in accordance with the preferred embodiment. However, the memory cells 110 can include any type of memory cells required in other embodiments of the present invention.

As shown in FIG. 1. In some embodiments of the present invention, the memory cells 110 are obtained, for example but not limited to, by performing following step. A plurality of shallow trench isolations (hereinafter abbreviated as STIs) 106 are formed in the memory cell region 102 and the peripheral region 104. In some embodiments of the present invention, a depth of the STIs 106 formed in the memory cell region 102 can be smaller than a depth of the STIs 106 formed in the peripheral region 104 as shown in FIG. 1. Alternatively, the depth of the STIs 106 in both of the memory cell region 102 and the peripheral region 104 can be the same in other embodiments of the present invention. The STIs 106 formed in the peripheral region 104 and the memory cell region 102 are used to define a plurality of active regions for accommodating p-typed transistor device(s) and/or n-typed transistor device(s), and to provide electrical isolation. Next, a plurality of recess 108 are formed in the substrate 100 and the STIs 106 in the memory cell region 102. And sidewalls and bottoms of each recess 108 are then lined with a dielectric layer 112. Subsequently, a buried gate 114 is respectively formed in the recesses 108 and followed by sealing the recesses 108 with an insulating layer 116. Consequently, memory cells 110 are obtained. However, it should be easily understood by those skilled in the art that the memory cells 110 can be formed by any other suitable fabricating steps.

Please still refer to FIG. 1. Then, a gate dielectric layer 120 is formed in the peripheral region 104. After forming the gate dielectric layer 120 in the peripheral region 104, a first semiconductor layer 122 is formed on the substrate 100 and patterned. Accordingly, the first semiconductor layer 122 remains in the peripheral region 104. And an insulating layer 124 covering the first semiconductor layer 122 is then formed on the substrate 100. As shown in FIG. 1, the insulating layer 124 contacts both the first semiconductor layer 122 and the substrate 100. In some embodiments of the present invention, the first semiconductor layer 122 includes an amorphous silicon layer, and a thickness of the first semiconductor layer 122 can be about 300 angstroms (Å), but not limited to this. In some embodiments of the present invention, the insulating layer 124 can be a multilayered structure including, for example but not limited to, oxide-nitride-oxide (ONO) structure, and a thickness of the insulating layer 124 can be larger than 80 Å. However, in other embodiments of present invention, the insulating layer 124 can be a dual-layered or single-layered structure, and the thickness of the insulating layer 124 may have any suitable value.

Figure 2:
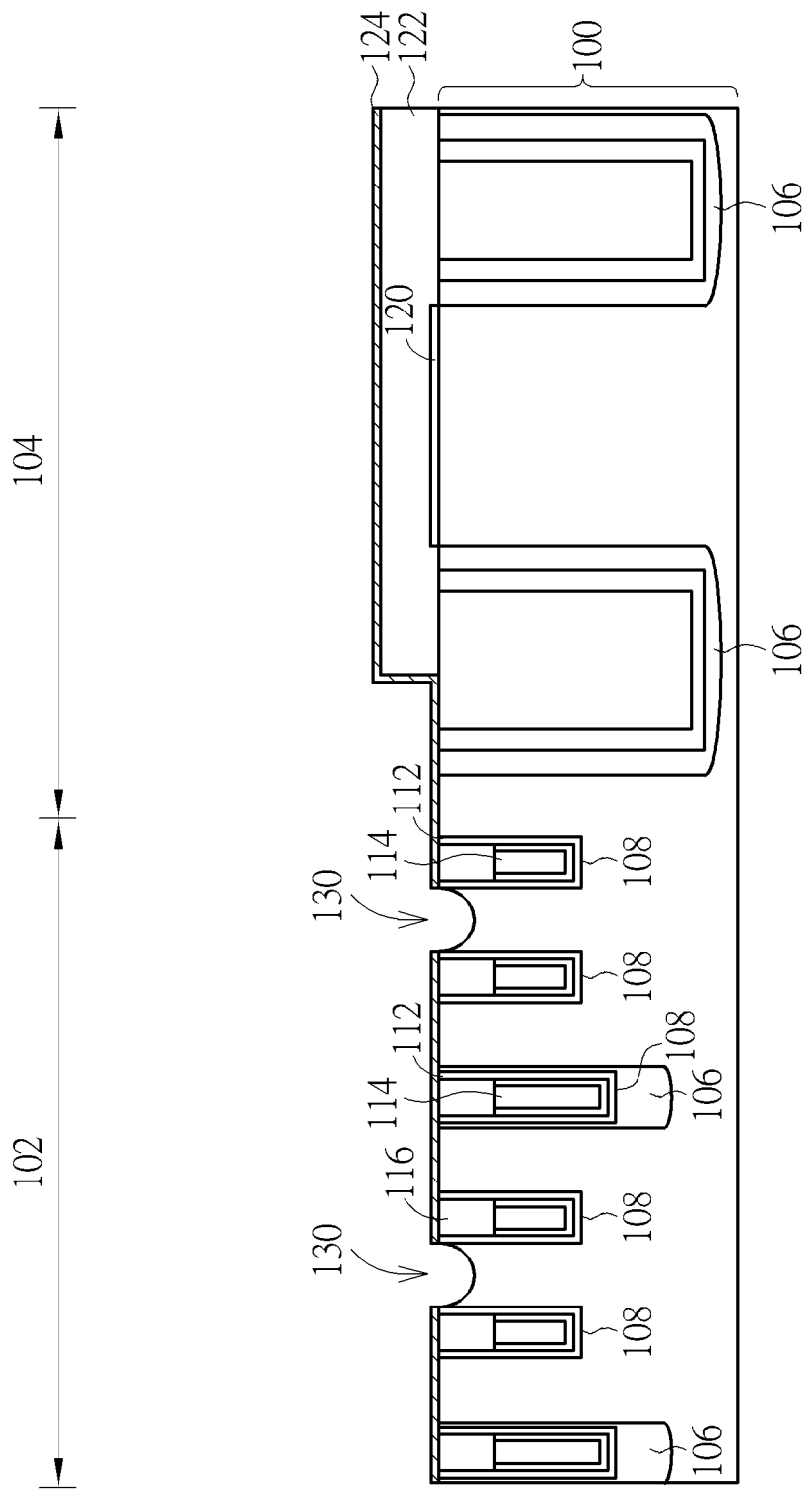

Please still refer to FIG. 1. Next, a sacrificial layer 126 is blanketly formed on the substrate 100 and a patterned hard mask 128 is formed on the sacrificial layer 126. The sacrificial layer 126 can be an organic density layer or an organic dielectric layer, but not limited to this. Preferably, the patterned hard mask 128 includes patterns defining placement and size of contact plugs to be formed. Thereafter, the patterns are transferred from the patterned hard mask 128 to the sacrificial layer 126, and thus a plurality of openings 128p are obtained as shown in FIG. 2. It is noteworthy that the insulating layer 124 is exposed at bottoms of the openings 128p.

Please refer to FIG. 2. Subsequently, the insulating layer 124 exposed at the bottoms of the openings 128p and portions of the substrate 100 under the exposed insulating layer 124 are removed. After removing the exposed insulating layer 124 and the substrate 100 underneath, a plurality of recesses 130 are formed in the memory cell region 102. It is noteworthy that the substrate 100 is therefore exposed at bottoms of the recesses 130. Next, dopants such as p-typed dopants are implanted into the substrate 100 exposed at the bottoms of the recesses. The dopants are introduced for leakage prevention. Thereafter, the sacrificial layer 126 and the patterned hard mask 128 are removed, as shown in FIG. 2.

Figure 3:
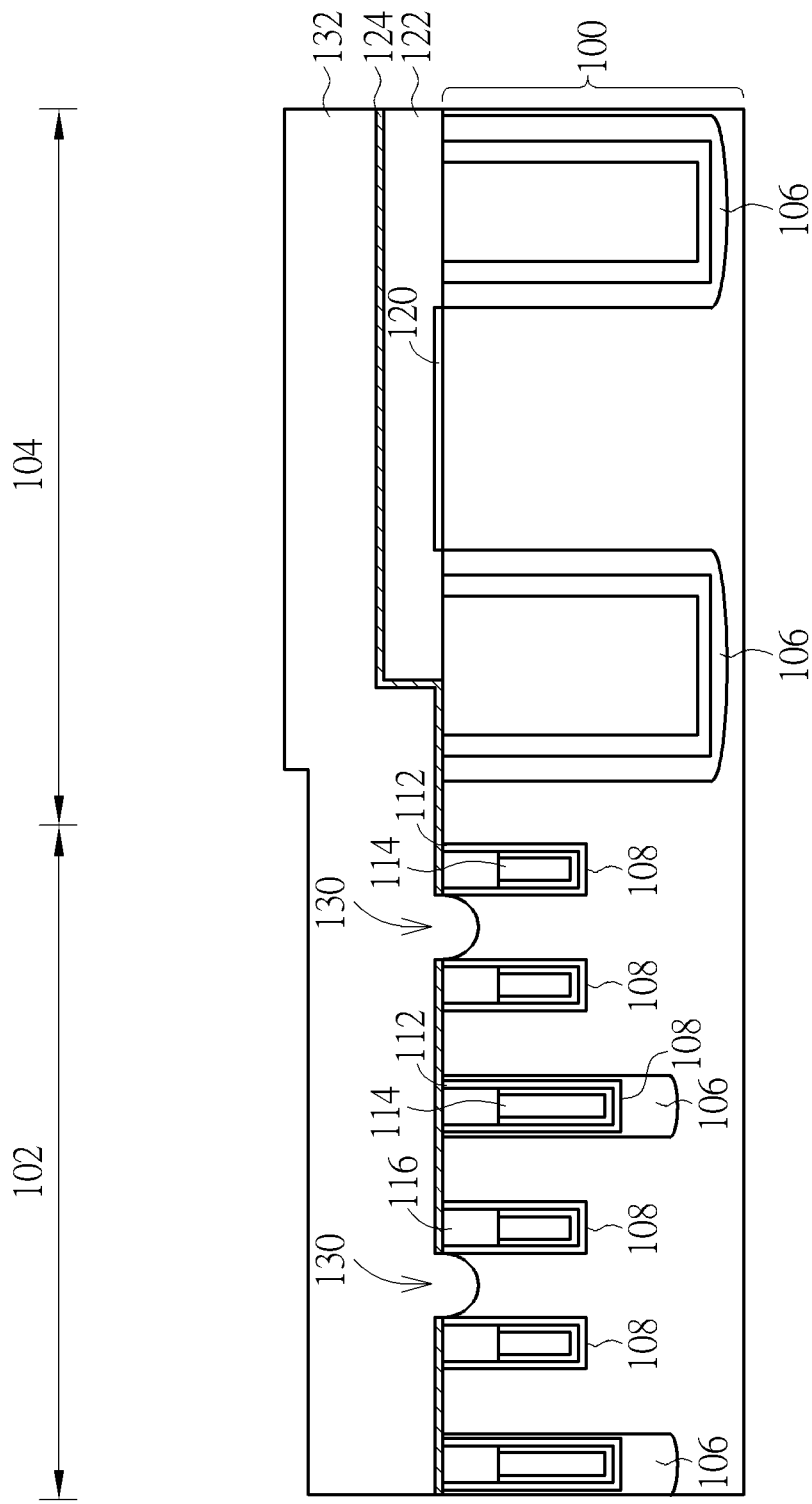

Please refer to FIG. 3. Next, a second semiconductor layer 132 is formed on the substrate 100. As shown in FIG. 3, the second semiconductor layer 132 covering the substrate 100, the first semiconductor layer 122 and the insulating layer 124. More important, the recesses 130 are filled up with the second semiconductor layer 132, and thus the second semiconductor layer 132 physically contacts the substrate 100 exposed at bottoms of the recesses 130. The second semiconductor layer 132 and the first semiconductor layer 122 preferably include a same material. Therefore in some embodiments of the present invention, the second semiconductor layer 132 includes a doped amorphous silicon layer, and a thickness of the second semiconductor layer 132 can be larger than 800 Å, but not limited to this.

Figure 4:
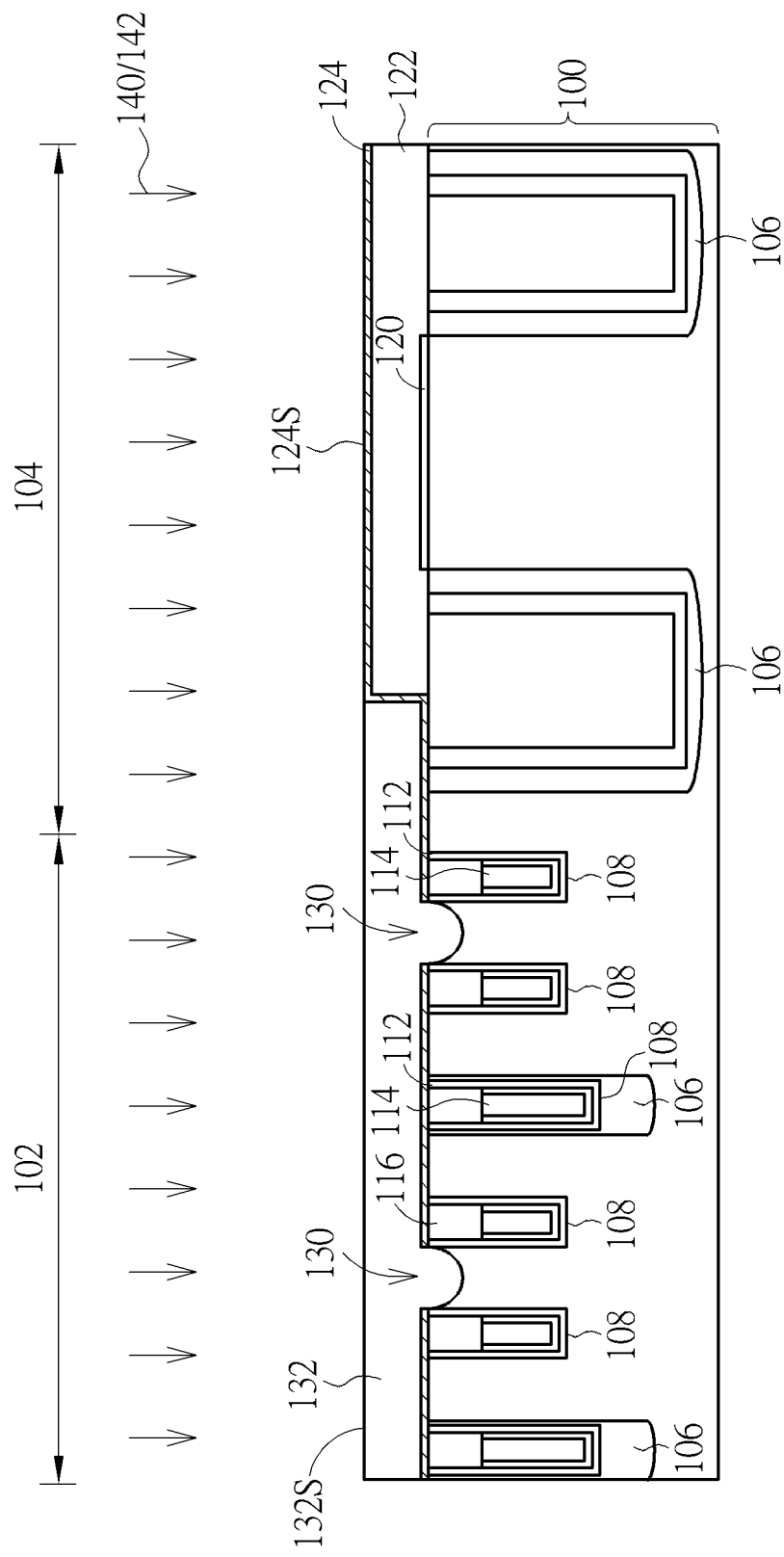

Please refer to FIG. 4. After forming the second semiconductor layer 132, a two-stepped planarization process, such as a two-stepped CMP process 140 is directly performed. The two-stepped CMP process 140 can be referred to a CMP with two steps performed in one apparatus. As shown in FIG. 4, a first planarization step 142 is performed to remove a portion of the second semiconductor layer 132, and the first planarization step 142 stops at the insulating layer 124. Consequently, the insulating layer 124 is exposed, and therefore a top surface 132S of the second semiconductor layer 132 and a top surface 124S of the insulating layer 124 are coplanar after the first planarization step 142 as shown in FIG. 4. Additionally, the first semiconductor layer 122 is still covered and protected by the insulating layer 124.

Figure 5:
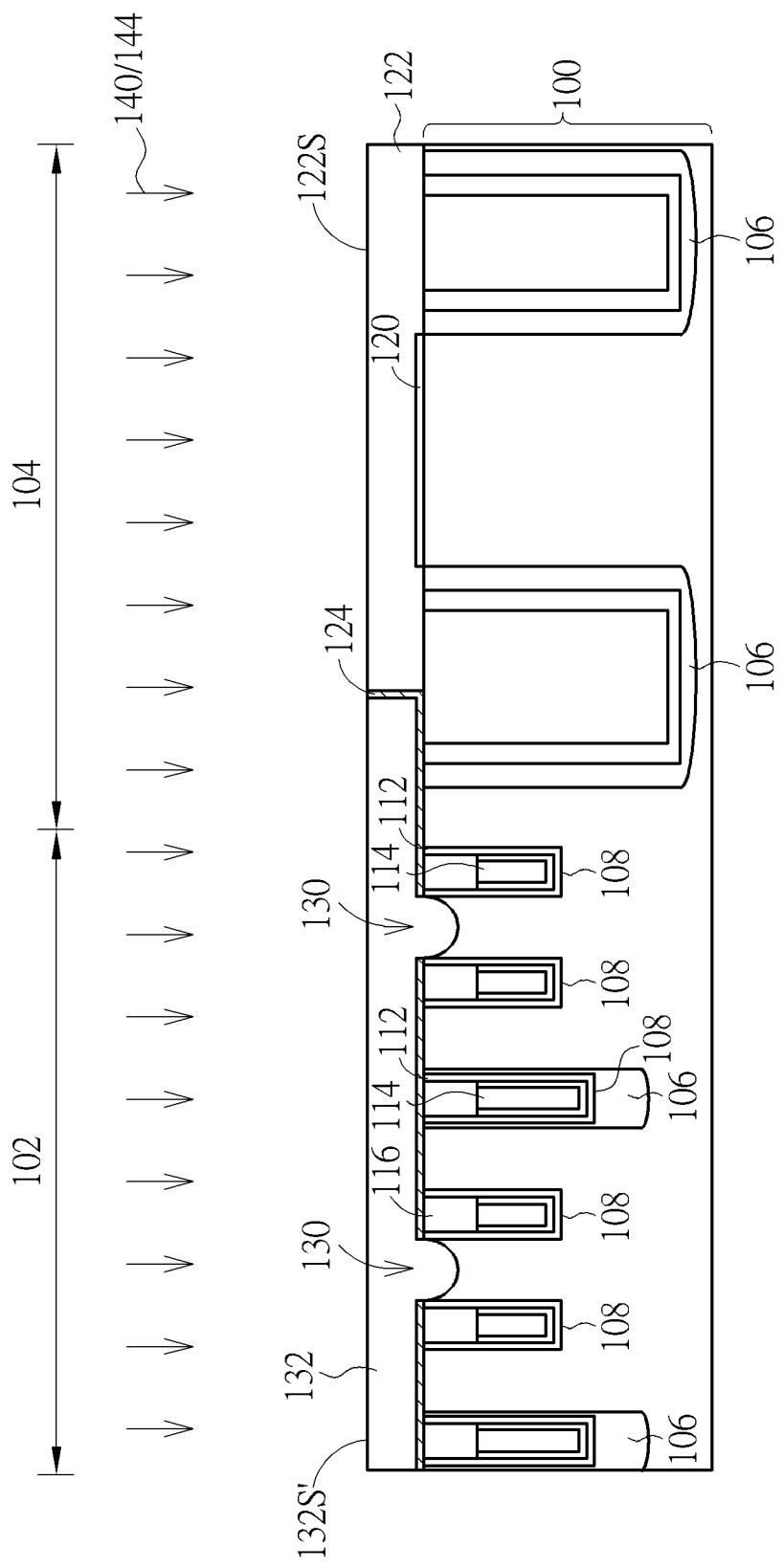

Please refer to FIG. 5. Subsequently, a second planarization step 144 is performed to remove a portion of the second semiconductor layer 132 and the insulating layer 124 to expose the first semiconductor layer 122. The second planarization step 142 preferably includes low removal rate (RR) with non-selectivity slurry, and thus the second semiconductor layer 132 and the insulating layer 124 are equally removed. Briefly speaking, the two-stepped CMP process 140 is performed to remove a portion of the second semiconductor layer 132 and the insulating layer 124 to expose the first semiconductor layer 122. Consequently, a top surface 122S of the first semiconductor layer 122 and the top surface 132S' of the second semiconductor layer 132 are coplanar after the second planarization step 144.

According to the method for forming the semiconductor IC structure, the planarization process is simplified to be the two-stepped planarization 140 which is completed in one apparatus. More important, high uniformity across regions with different densities is still guaranteed.

Please refer to FIGS. 1-2 and 6-9, which are schematic drawings illustrating a method for forming a semiconductor IC structure provided by a second preferred embodiment of the present invention. It is noteworthy that elements the same in both of the first and second preferred embodiments are designated by the same numerals and can be formed by the same steps with the same material. Therefore, details about those elements are omitted hereinafter in the interest of brevity. It is noteworthy that the second preferred embodiment includes some steps identical to the first preferred embodiment as shown in FIGS. 1-2, and thus all details about those steps are omitted for simplicity. Briefly speaking, a substrate 100 including a memory cell region 102 and a peripheral region 104 defined thereon is provided, and a plurality of memory cells 110 are formed in the memory cell region 102 as shown in FIG. 1. A gate dielectric layer 120 and a first semiconductor layer 122 are formed in the peripheral region 104 and an insulating layer 124 covering the first semiconductor layer 122 is formed on the substrate 100 as shown in FIG. 2. And a plurality of recesses 130 exposing the substrate 100 are formed in the memory cell region 102 as shown in FIG. 2. As mentioned above, dopants for leakage prevention can be introduced after forming the recesses 130.

Figure 6:
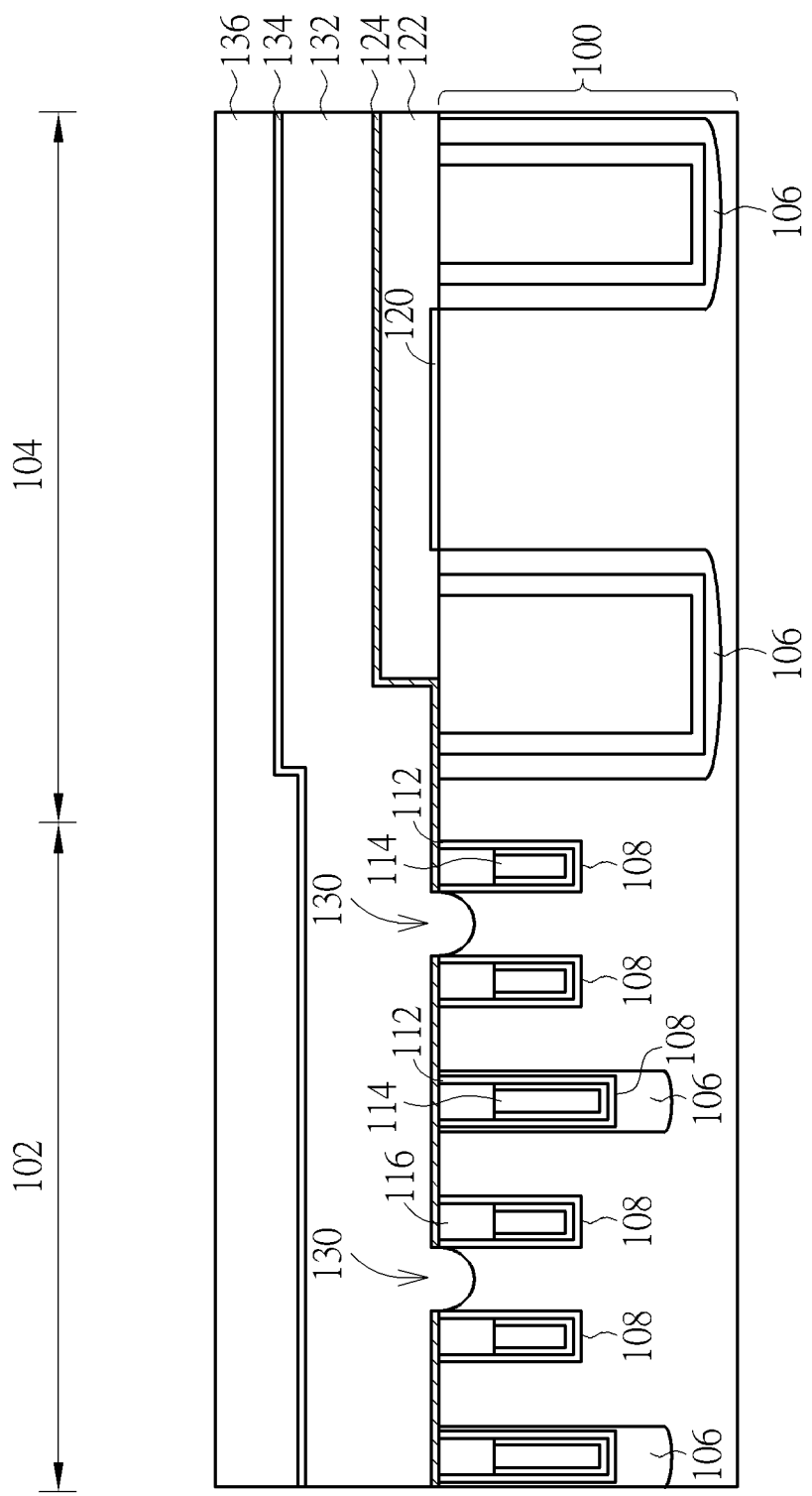

Please refer to FIG. 6. Next, a second semiconductor layer 132, another insulating layer 134 and still another insulating layer 136 are sequentially formed on the substrate 100. As shown in FIG. 6, the second semiconductor layer 132, the insulating layer 134 and the insulating layer 136 cover the first semiconductor layer 122 and the insulating layer 124. As mentioned above, the recesses 130 are filled up with the second semiconductor layer 132, and thus the second semiconductor layer 132 physically contacts the substrate 100 exposed at bottoms of the recesses 130. The second semiconductor layer 132 and the first semiconductor layer 122 preferably include a same material. Therefore in some embodiments of the present invention, the second semiconductor layer 132 includes an amorphous silicon layer. Preferably, the second semiconductor layer 132 includes a doped amorphous silicon layer. And a thickness of the second semiconductor layer 132 can be larger than 800 Å, but not limited to this. It is noteworthy that the insulating layer 134 and the insulating layer 136 include different materials. For example but not limited to, the insulating layer 136 includes silicon oxide (SiO) while the insulating layer 134 sandwiched between the insulating layer 136 and the second semiconductor layer 132 includes silicon nitride (SiN). Furthermore, a thickness of the insulating layer 134 is larger than 50 Å while the insulating layer 136 is larger than 800 Å, but not limited to this. It is noteworthy that the insulating layer 136 is preferably thick enough to form an even surface as shown in FIG. 6.

Figure 7:
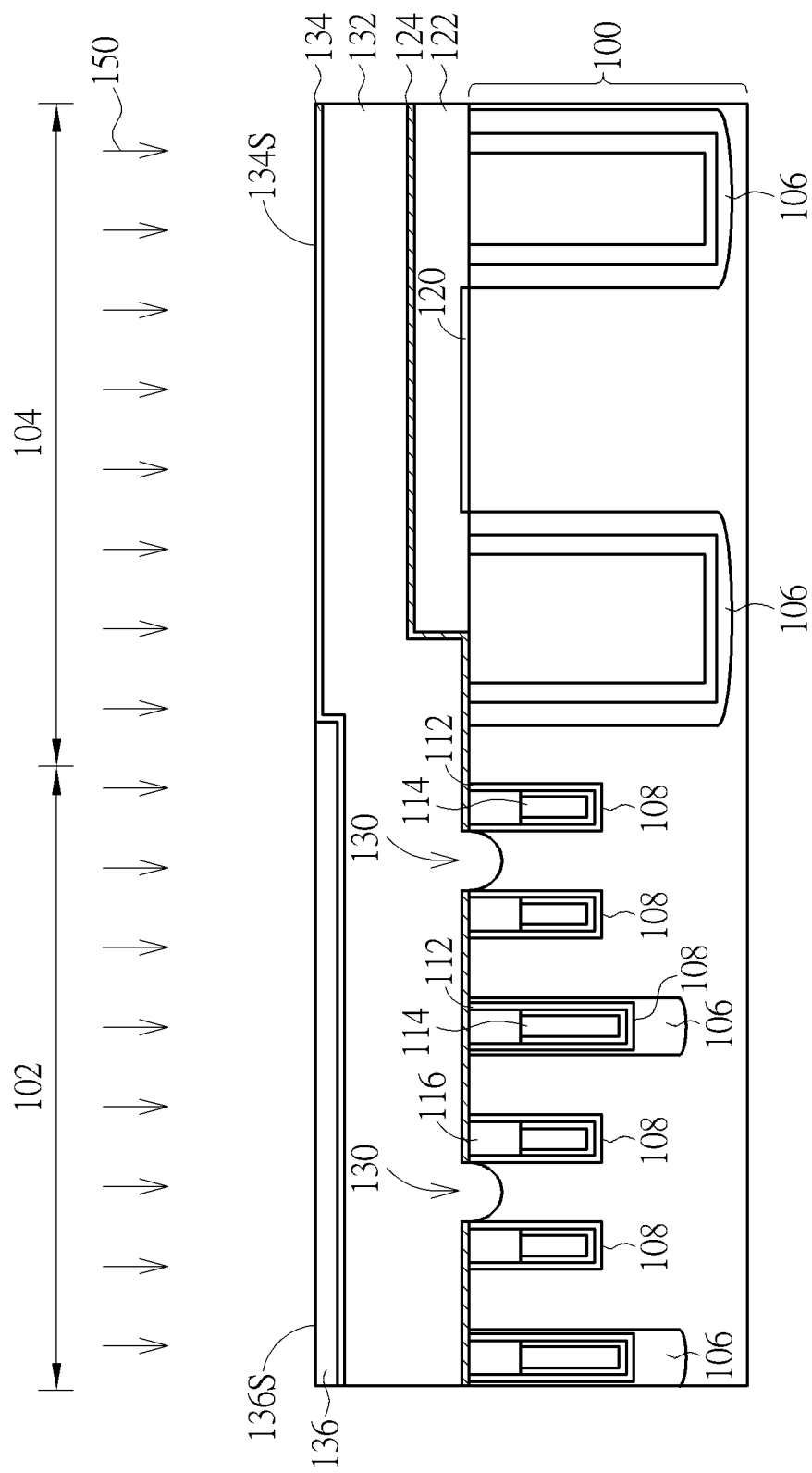

Please refer to FIG. 7. After forming the insulating layer 136, a planarization process, such as a CMP process 150 is performed. As shown in FIG. 7, the CMP process 150 is performed to remove a portion of the third insulating layer 136 and stops at the insulating layer 134. Consequently, the insulating layer 134 is exposed, and thus a top surface 134S of the insulating layer 134S and a top surface 136S of the insulating layer 136 are coplanar.

Figure 8:
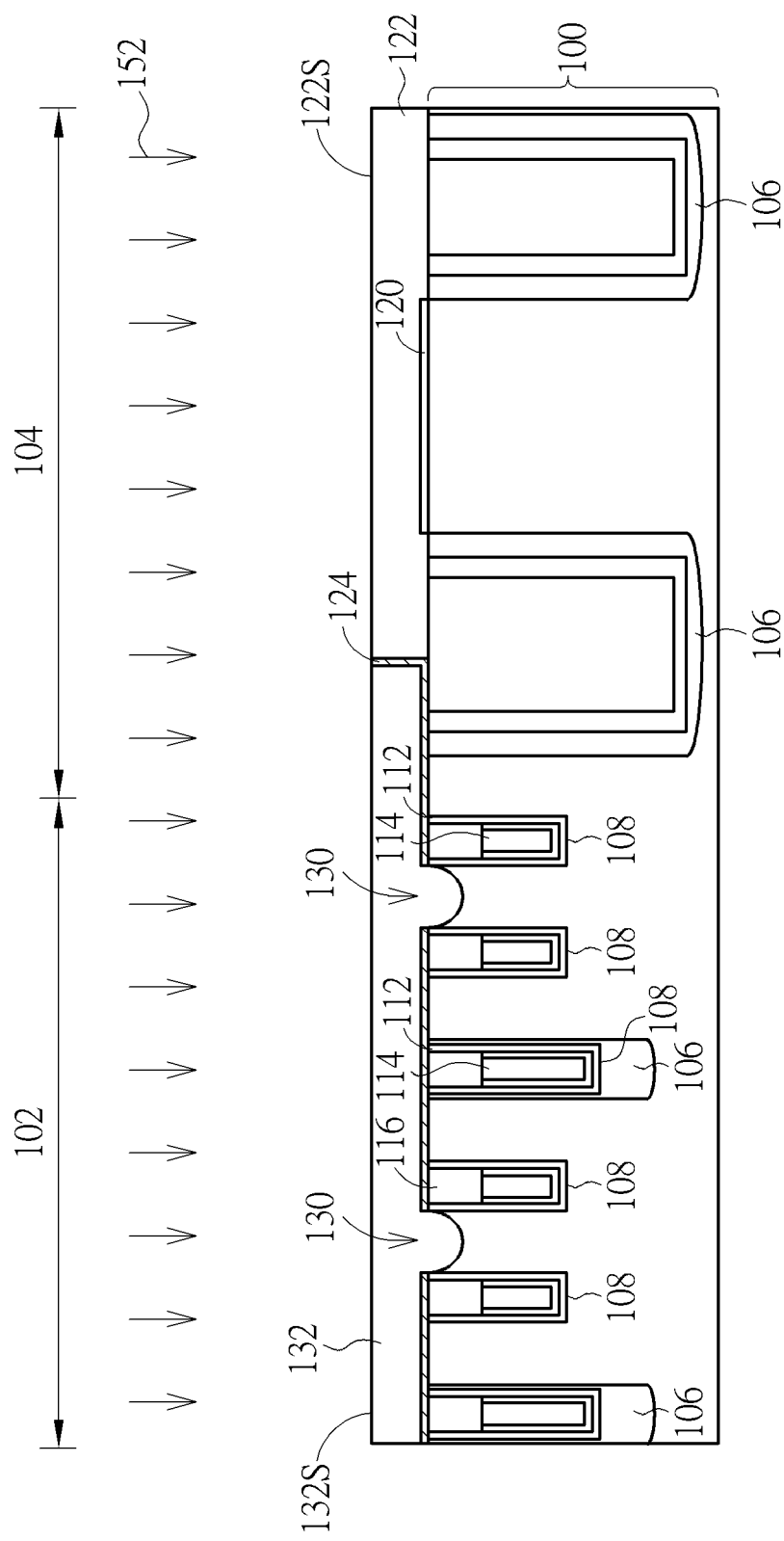

Please refer to FIG. 8. Subsequently, an etching back process 152 is performed to remove the insulating layer 136, the insulating layer 134, a portion of the second semiconductor layer 132 and a portion of the insulating layer 124. Additionally, the insulating layer 136 and insulating layer 134 are entirely removed as shown in FIG. 8. Thus, the first semiconductor layer 122 is exposed. Accordingly, a top surface 122S of the first semiconductor layer 122 and a top surface 132S of the second semiconductor layer 132 are coplanar after the etching back process 152.

According to the method for forming the semiconductor IC structure, the insulating layer 136 and the insulating layer 134 are introduced to eliminate the step height issue. Consequently, high uniformity across regions with different densities is guaranteed.

Figure 9:
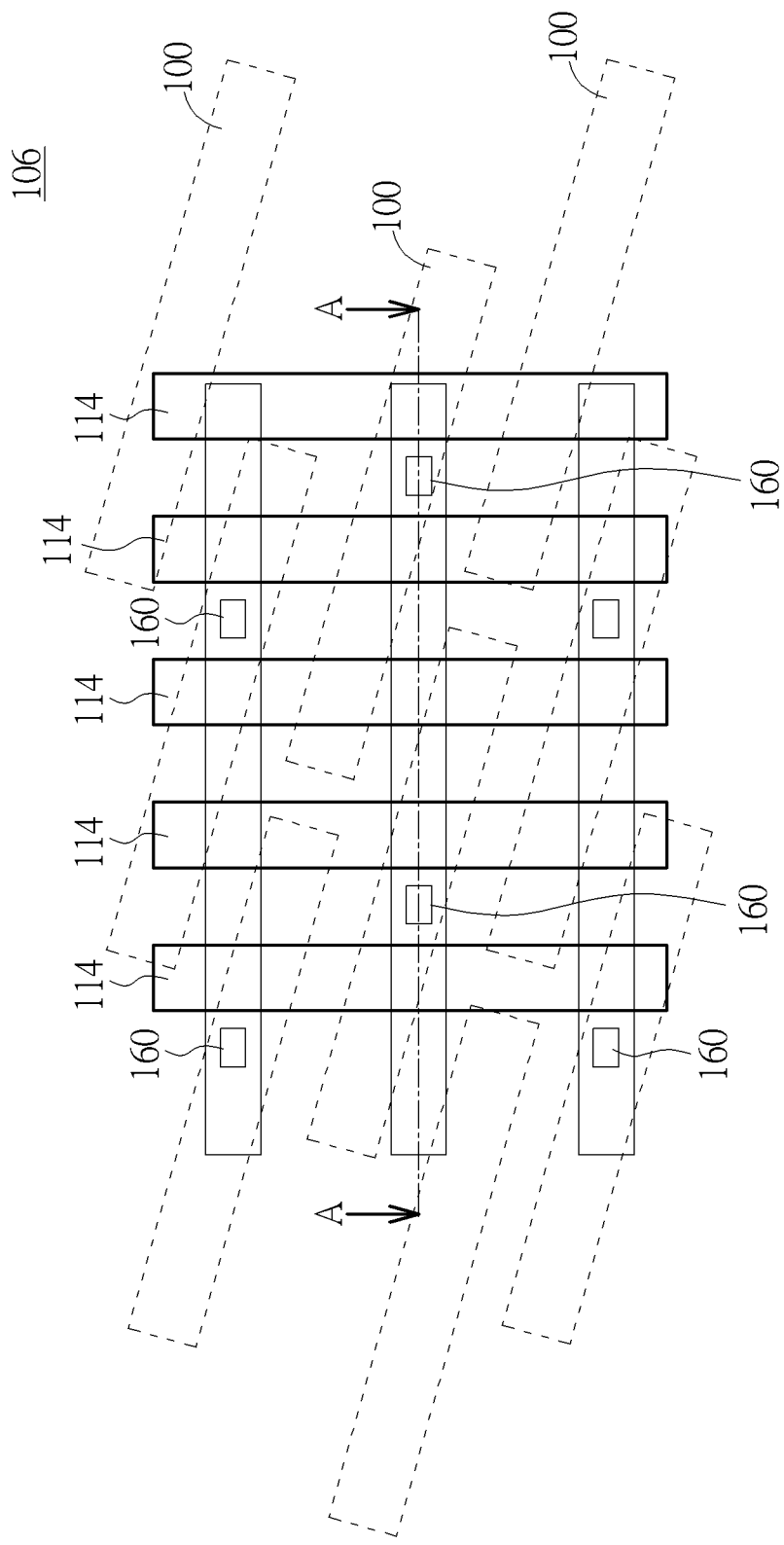
Figure 10:
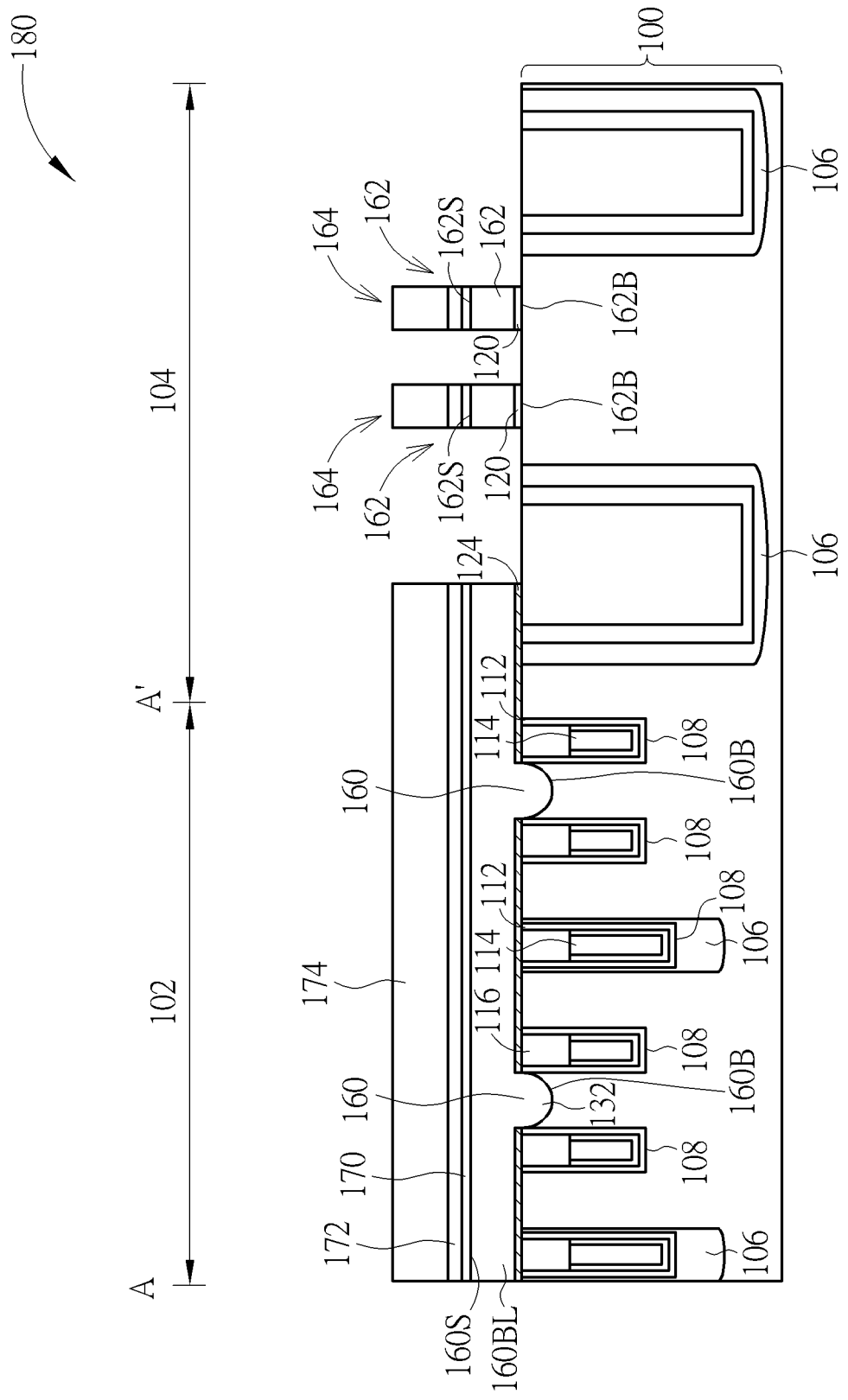

Please refer to FIGS. 9 and 10, which is a schematic drawing in a step subsequent to both FIG. 5 and FIG. 8. It is noteworthy that the memory cell region 102 depicted in FIG. 10 is also a cross-sectional view take along a line A-A' of FIG. 9. After obtaining the even surface 122S/132S formed by the first semiconductor layer 122 and the second semiconductor layer 132, a multilayered structure is formed on the substrate 100. In some embodiments of the present invention, the multilayered structure can include, for example but not limited to, a Ti/TiN layer 170, a $WSi_x$/W layer 172 and a patterned hard mask 174. Additionally, the patterned hard mask 174 can include a SiO layer and/or a SiN layer, but not limited to this. The Ti/TiN layer 170, the $WSi_x$/W layer 172, the first semiconductor layer 122 and the second semiconductor layer 132 are then respectively patterned. Consequently, a plurality of contact plugs 160 and at least a bit line 160BL are formed in the memory cell regions 102 and at least a gate electrode 162 is formed in the peripheral region 104 as shown in FIGS. 9 and 10. As shown in FIG. 10, the contact plugs 160 include the second semiconductor layer 132, and the bit line 160BL includes the second semiconductor layer 132 and the abovementioned multilayered structure. Additionally, the substrate 100 in the memory cell region 102 is depicted by the dotted lines and surrounded by the STIs 106 while the peripheral region 104 is omitted as shown in FIG. 9. Thereafter, steps for forming an active device 164 such as a transistor are performed. Consequently, a semiconductor IC structure 180 is obtained. The semiconductor IC structure 180 includes the substrate 100 including the memory cell region 102 and the peripheral region 104 defined thereon, the memory cells 110 formed in the memory cell region 102, the active devices 164 formed in the peripheral region 104, and the contact plugs 160 formed in the memory cell region 102. More important, bottom surfaces 160BL of the contact plugs 160 are lower a surface 100S of the substrate 100 and bottom surfaces 162B of the gate electrode 162. More important, the contact plugs 160 are physically and electrically connected to the bit line 160BL. And top surfaces 162S of the gate electrodes 162 are coplanar with a top surface 160S of the bit line 160BL. Additionally, since the gate electrode 162 includes the first semiconductor layer 122, and the contact plugs 160 and the bit line 160BL include the second semiconductor layer 132, it is concluded that the contact plugs 160 and the bit lines 162 in the memory cell region 102 and the gate electrodes 162 of the active device 164 include the same material.

According to the method for forming the semiconductor IC structure, the planarization process is simplified to be the two-stepped planarization which is completed in one apparatus. Or, the third insulating layer and the second insulating layer are introduced to eliminate the step height issue. Consequently, high uniformity across regions with different densities is guaranteed.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor integrated circuit (IC) structure comprising:
   a substrate comprising at least a memory cell region and a peripheral region defined thereon;
   a plurality of memory cells formed in the memory cell region;
   at least an active device formed in the peripheral region;
   a plurality of contact plugs formed in the memory cell region, and bottom surfaces of the contact plugs being lower than a surface of the substrate; and
   at least a bit line formed in the memory cell region, and the contact plugs being physically and electrically connected to the bit line, wherein the active device comprises:
   at least a gate electrode; and
   a gate dielectric layer disposed between the gate electrode and the substrate, wherein the gate electrode comprises a semiconductor layer directly contacting the gate dielectric layer, and a top surface of the semiconductor layer is coplanar with a top surface of the bit line.

2. The semiconductor IC structure according to claim 1, wherein the memory cells comprise dynamic random access memory (DRAM) cells.

3. The semiconductor IC structure according to claim 1, wherein a top surface of the gate electrode is coplanar with the top surface of the bit line.

4. The semiconductor IC structure according to claim 3, wherein the bottom surfaces of the contact plugs are lower than a bottom surface of the gate electrode.

5. The semiconductor IC structure according to claim 3, wherein the contact plugs and the bit line in the memory cell region and the gate electrode of the active device in the peripheral region comprise a same material.

6. The semiconductor IC structure according to claim 1, wherein the bottom surfaces of the contact plugs are lower than a bottom surface of the gate dielectric layer.

7. The semiconductor IC structure according to claim 1, wherein a topmost surface of the semiconductor layer is coplanar with a topmost surface of the bit line.

* * * * *